United States Patent [19]
Yamaguchi et al.

[11] Patent Number: 5,914,274
[45] Date of Patent: Jun. 22, 1999

[54] SUBSTRATE ON WHICH BUMPS ARE FORMED AND METHOD OF FORMING THE SAME

[75] Inventors: Kazufumi Yamaguchi, Osaka; Tsutomu Mitani, Hyogo; Mitsuo Asabe, Osaka, all of Japan

[73] Assignee: Matsushita Electric Industrial Co., Ltd., Osaka, Japan

[21] Appl. No.: 09/053,270

[22] Filed: Apr. 1, 1998

Related U.S. Application Data

[62] Division of application No. 08/820,779, Mar. 18, 1997.

[30]   Foreign Application Priority Data

Mar. 21, 1996  [JP]  Japan ..................................... 8-064237

[51] Int. Cl.⁶ ............................... H01L 21/00; B44C 1/22
[52] U.S. Cl. ............................... 438/690; 216/11; 216/14; 216/52; 438/694
[58] Field of Search ................... 216/11, 14, 18, 216/39, 52; 438/613–617, 637, 675, 666, 690, 694, 723, 743; 257/737, 738

[56] References Cited

U.S. PATENT DOCUMENTS

| | | | |
|---|---|---|---|
| 4,887,760 | 12/1989 | Yoshino et al. . | |
| 5,246,880 | 9/1993 | Reele et al. ................................ | 216/11 |
| 5,336,547 | 8/1994 | Kawakita et al. . | |
| 5,487,999 | 1/1996 | Farnworth ................................. | 216/18 |

FOREIGN PATENT DOCUMENTS

| | | |
|---|---|---|
| 0 768 708 | 4/1997 | European Pat. Off. . |
| 58-121649 | 7/1983 | Japan . |
| 63-6860 | 1/1988 | Japan . |
| 1-22049 | 1/1989 | Japan . |
| 1-084738 | 3/1989 | Japan . |
| 2-172230 | 7/1990 | Japan . |
| 04-035040 | 2/1992 | Japan . |
| 4-053138 | 2/1992 | Japan . |
| 4-083366 | 3/1992 | Japan . |
| 7-115097 | 5/1995 | Japan . |

OTHER PUBLICATIONS

"High Reliability Chip–Joining Process", *IBM Technical Disclosure Bulletin*, vol. 33, No. 12, pp. 237–238.

*Primary Examiner*—William Powell
*Attorney, Agent, or Firm*—Merchant, Gould, Smith, Edell, Welter & Schmidt, P.A.

[57]   ABSTRACT

A bi-layer bump comprises a base layer composed of sprayed aluminum thick film having a thickness of about 20 μm formed to cover the periphery of the passivation film formed on each pad electrode, a surface layer composed of sprayed copper thick film having a thickness of about 30 μm formed on the base layer. According to the above-mentioned structure, a substrate on which bumps are formed which has an excellent electric property and connecting reliability, wherein an interlayer insulating layer, an active layer and a multi-layer wiring can be provided under the pad electrode can be obtained.

6 Claims, 8 Drawing Sheets

SUBSTRATE ON WHICH BUMPS ARE FORMED AND METHOD OF FORMING THE SAME

This application is a Divisional of U.S. application Ser. No. 08/820,779, filed Mar. 18, 1997, which application are incorporated herein by reference.

FIELD OF THE INVENTION

The present invention relates to a substrate on which bumps are formed on an electrode on a semiconductor chip or wafer, an electrode on the circuit board and an electrode on various kinds of electronic parts and a method of forming the same.

BACKGROUND OF THE INVENTION

In realizing miniaturization, lightening or increased performance of electronic apparatus and systems, high density mounting of the semiconductor integrated circuit is indispensable. Among the various kinds of high density mounting techniques, chip size package (CSP) and multi-chip module (MCM) by which bare chips are mounted on a carrier substrate or on a circuit board have been developed and put to practical use. The bare chip mounting technique has important subjects such as the improvement of the "flip chip connecting technique" by which bare chips are connected on the electrode formed on the substrate via bumps, and a reduction of the cost of the flip chip connecting technique.

The flip chip connecting technique to mount bare chips, which are turned over, on the circuit substrate via bumps is an excellent method which is suitable for high density mounting since an extra area in addition to the region of the chip is not required for connecting. The material, structure and forming method of the bumps, which play an important role in flip chip connecting, have been studied and some of them have been put in practical use. There are two main methods to form bumps. Hereinafter, the methods will be explained as follows.

The first method to form bumps is the "soldering bump method" in which, after a barrier metal layer is deposited on the pad electrode of each chip formed on the semiconductor wafer, a solder layer having 10 to 50 $\mu$m thickness is formed. In this case, the solder layer is formed by a vacuum deposition method, (refer to Japanese Patent Application No. 4939 of 1988), an electrolytic plating method, (refer to Japanese Patent Application No. 6860 of 1988), or a soldering ball method (refer to Japanese Patent Application No. 22049 of 1989).

The second method to form bumps is the "ball bonding method", in which ball bonding is performed on a pad electrode by a wire-bonding device and a gold wire, and gold ball having a height of about 50 $\mu$m is formed on the pad electrode. According to the second method, a barrier metal layer is not required as is necessary for the above-mentioned first method, the soldering bump method, and therefore bumps can be formed on the ordinary semiconductor chip.

However, in a case when bumps are formed by the soldering bump method, it is required to form a barrier metal layer. The barrier metal layer is formed by laminating a thin film of titanium, nickel or chromium with a vacuum deposition method or a sputtering method. Therefore, the cost and the time required for forming bumps are increased. In addition to that, it is required for the solder layer as a bump to have a thickness more than several tens $\mu$m, and therefore, it takes time to deposit the solder layer by the vacuum deposition method. As a result, the cost required for forming bumps is increased. When the solder layer is formed by the electrolytic plating method, the thickness of the plating film varies according to electric field distribution, it requires a long time for plating and a common electrode is required to connect all pads electrically in advance. When the solder layer is formed by the soldering ball method, solder balls having a uniform diameter are required and all solder balls are required to be formed on the electrode without omission.

According to the ball bonding method, bonding is performed for every pad electrode, and therefore, even a high-speed bonder can perform bonding on 6 to 8 pieces per second. Consequently, with the increase of the number of pads, the time required for forming bumps increases and the cost rises extremely. Therefore, the ball bonding method is not suitable for mass production. In addition to that, when bumps are formed by the ball bonding method, an interlayer insulating layer, an active layer and a multi-layer interconnection are likely to be damaged by shock in bonding. Therefore, it becomes difficult for the above-mentioned layers to be formed under the pad electrode. As a result, it is difficult to provide the above-mentioned layers under the pad electrode to achieve high integration of a chip.

SUMMARY OF THE INVENTION

This invention aims to solve the above-mentioned subjects and provide a substrate on which bumps are formed having excellent electric properties and connecting reliability. This invention also aims to provide a substrate on which bumps are formed in which an interlayer insulating layer, an active layer and a multi-layer interconnection can be formed under the pad electrode, and a method of forming the same.

In order to achieve the above-mentioned objective, this invention provides bumps composed of conductive material formed on the electrode, wherein the bumps are comprised of at least one layer of sprayed metal thick film. According to the above-mentioned construction of the substrate on which bumps are formed, the following effects can be obtained. Unlike the bumps formed by the printing method, the bumps composed of sprayed metal film do not contain organic binder components and have a high degree of purity. Therefore, the bumps have small electric resistance, and gas is not released from the bumps after being mounted, and as a result, the bumps have a high reliability. Further, the sprayed metal thick film has a pore or a clearance inside, therefore, absorbs stress easily in comparison with the bulk. Accordingly, the stress applied to the bump caused by the difference of thermal expansion between the circuit board and the semiconductor chip on which the bumps are formed can be reduced, and therefore the reliability of connecting can be increased.

Further, the sprayed metal thick film has a pore or a clearance inside, so that connecting material such as solder or conductive paste soaks through the clearance and into the inside of the bumps. As a result, the contact area between the bumps and connecting material increases, and the contact resistance can be reduced. In addition to that, unlike the bumps formed by the ball bonding method, bumps composed of sprayed metal film might not destroy an interlayer insulating layer, an active layer and a multi-layer interconnection. Therefore, the above-mentioned layers can be provided under the electrode, and as a result, high integration can be performed.

According to the constitution of the bumps formed on the substrate, it is preferable that the bumps are composed of a base layer formed on the electrode and a surface layer formed on the base layer. It is preferable that the material of the base layer is one selected from a group consisting of aluminum, metal containing aluminum, zinc and metal containing zinc. It is preferable that the material of the surface layer is one selected from a group consisting of copper and metal containing copper.

According to the constitution of the substrate on which bumps are formed, it is preferable that bumps are composed of a base layer formed on the electrode, an intermediate layer formed on the base layer and a surface layer formed on the intermediate layer. It is preferable that the material of the base layer is one selected from a group consisting of aluminum, metal containing aluminum, zinc and metal containing zinc. it is preferable that the material of the intermediate layer is one selected from a group consisting of copper and metal containing copper. It is preferable that the material of the surface layer is solder.

According to the constitution of the substrate on which bumps are formed, it is preferable to provide a resist film having an opening portion formed on the electrode, wherein bumps composed of sprayed metal thick film protruding from the top face of the resist film are provided in the opening portion. According to the preferable example, damage in a process connecting the semiconductor chip on which the bumps are formed and the circuit board can be prevented. In this case, it is preferable that the material for the resist film is one selected from a group consisting of heat resistant resin and flame retardant resin. According to the constitution of the substrate on which bumps are formed, it is preferable that the bumps are composed of conductive material containing a clearance which can adsorb liquid material, and the clearance is filled with moisture proof material. According to the preferable example, an increase of electric resistance can be prevented by preventing the bumps from being oxidized. In this case, the moisture proof material is one selected from a group consisting of epoxy based resin, silica based resin, acrylic based resin and fluorine based resin. In this case, it is preferable that the side surface of the bump is covered with moisture proof material. According to the preferable example, an increase of electric resistance can be further prevented by further preventing the inside of the bumps from being oxidized. Accordingly, even if the bumps are used for long periods under high temperature and high moisture, the electric resistance of bumps is not increased. Therefore, bumps having stable electric properties and high reliability can be realized. In this case, the moisture proof material is one selected from a group consisting of epoxy based resin, silica based resin, acrylic based resin and fluorine based resin. According to the constitution of the substrate on which bumps are formed, it is preferable that bumps are formed to have a two-step shape. According to the preferable example, when the semiconductor chip on which the bumps are formed is connected with circuit board using conductive resin or solder, the protruding portion of the first stage can serve as a reservoir for the conductive resin or solder. As a result, an excess of the conductive resin or solder is not spread over the substrate. Therefore, mounting of bumps with high accuracy can be performed.

According to the method of forming bumps of this invention, a particle of conductive material is deposited on the electrode formed on the substrate to form bumps, wherein at least one portion of the surface oxidation layer of the electrode is removed or penetrated by the particle of the conductive material in depositing the particle of the conductive material on the electrode. According to the method of forming bumps, contact resistance between the electrode formed on the substrate and bumps can be reduced enough for practical use.

According to the method of forming bumps of this invention, it is preferable that the particle of conductive material is deposited on the electrode by a spraying method. In this case, it is preferable that the spraying method is a plasma spraying method. In this case, it is preferable that a region where the particle of the conductive material hits has at least an inert atmosphere, or a reducing atmosphere. According to the preferable example, bumps formed on the substrate can be prevented from being oxidized, and therefore, bumps having small resistance and high quality can be obtained.

According to the method of forming bumps of this invention, it is preferable that superplastic metal material is used as a conductive material for the upper layer of the bumps. It is preferable that after the superplastic metal material is deposited, the substrate is heated to be a temperature higher than the superplasticity temperature, a concave die having a desirable carved shape is pushed on the bumps and the bumps are formed in the desired shape. According to the preferable example, two-step shape bumps can be obtained easily. In this case, it is preferable that the superplastic metal material is one selected from a group consisting of eutectoid alloy containing zinc and aluminum, eutectoid alloy containing bismuth and tin, eutectoid alloy containing magnesium and aluminum and eutectoid alloy containing lead and tin.

DETAILED DESCRIPTION OF THE INVENTION

Hereinafter, more details of this invention will be explained referring to embodiments.

First Embodiment

Figure 1:
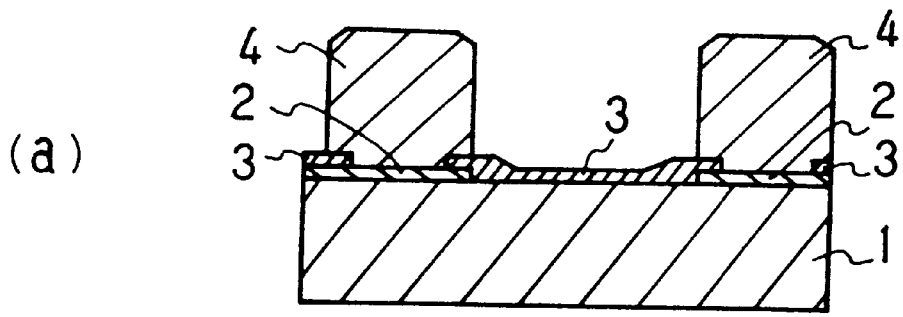
FIG. 1(a) is a cross sectional view showing an example of a substrate on which bumps are formed in a first embodiment of this invention.
FIG. 1(b) is a cross sectional view showing an example of a substrate on which bumps are formed in the first embodiment of this invention.
FIG. 1(c) is a cross sectional view showing an example of a substrate on which bumps are formed in the first embodiment of this invention.
Figure 1:
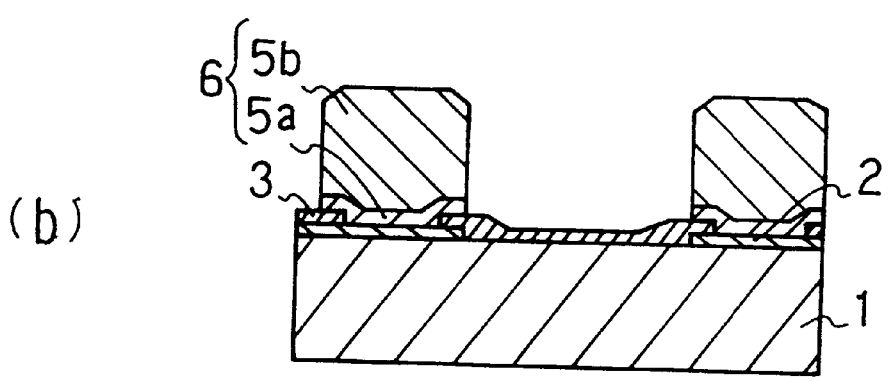
Figure 1:
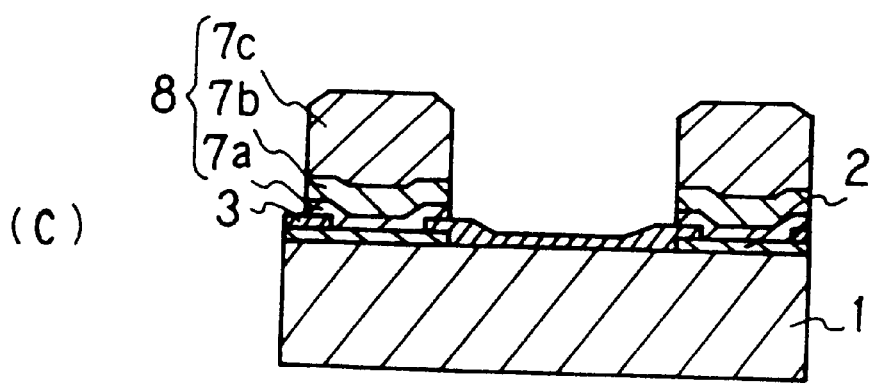

FIGS. 1(a), (b) and (c) are cross sectional views showing three examples of a substrate on which bumps are formed in the first embodiment of this invention. FIG. 1(a) shows the case in which bumps have single layer constitution, FIG. 1(b) shows the case in which bumps have a bi-layer constitution and FIG. 1(c) shows the case in which bumps have a tri-layer constitution. Hereinafter, the details of each case will be explained.

As shown in FIG. 1(a), on the surface of the semiconductor chip 1, a pad electrode 2 serving as a power source, ground, in-put and out-put terminal of signal is provided on the periphery of the chip. In recent years, LSI, in which pad electrodes are provided forming two dimensional array on the surface of the chip, has been developed in order to increase the density of the pad electrode with the increase of in-put and out-put terminal of the semiconductor chip. In general, the pad electrode 2 is an aluminum thin film deposited by an electronic beam deposition method or a sputtering method. On the surface of the semiconductor chip 1, a passivation film 3 is formed to cover the periphery of the pad electrode 2. On each pad electrode 2, a bump 4, which is a protruding connecting electrode, is provided to cover the periphery of the passivation film 3. The bump 4 is composed of a single layer of sprayed copper thick film having a thickness of about 50 μm.

As shown in FIG. 1(b), a base layer 5a composed of sprayed aluminum thick film having a thickness of about 20 μm is provided at each pad electrode 2 to cover the periphery of the passivation film 3. In this case, the material of the base layer 5a is not limited to aluminum. In addition to aluminum, metal containing 60 wt. % and above of aluminum, zinc, and metal containing 60 wt. % and above of zinc may be used. The above-mentioned metals have small electric resistance and the base layer 5a composed of the above-mentioned metals can be adhered strongly to the pad electrode 2 (aluminum thin film). The above-mentioned metals have a low melting point. Therefore, damage to the semiconductor chip 1 in spraying can be reduced extremely, as a result, these metals are preferable materials for forming bumps. On the base layer 5a, a surface layer 5b composed of sprayed copper thick film having a thickness of about 30 μm is formed. A bump 6 having bi-layer construction is composed of the base layer 5a and the surface layer 5b. The other aspects of the construction are the same as that of FIG. 1(a), and therefore, explanation about these other aspects is omitted.

As shown in FIG. 1(c), a base layer 7a composed of sprayed aluminum thick film having a thickness of about 20 μm is provided at each pad electrode 2 to cover the periphery of the passivation film 3. On the base layer 7a, an intermediate layer 7b composed of sprayed copper thick film having a thickness of about 30 μm is provided. In this case, the material of the intermediate layer 7b is not limited to copper. In addition to copper, a metal containing 60 wt. % and above of copper, zinc, and metal containing 60 wt. % and above of zinc may be used. The above-mentioned metals have small electric resistance and preferable soldering wettability. In addition to that, the material of the base layer 7a is not limited to aluminum. In addition to aluminum, metal containing 60 wt. % and above of aluminum, zinc, and metal containing 60 wt. % and above of zinc may be used. The above-mentioned metals have large ductility, therefore, the base layer comprising the above-mentioned metals exhibits excellent cushioning effects when an intermediate layer is formed on the base layer. On the intermediate layer 7b, a surface layer 7c composed of solder having a thickness of about 60 μm is formed. A bump 8 having a tri-layer construction is composed of the base layer 7a, the intermediate layer 7b and the solder surface layer 7c. After the above-mentioned bump having a bi-layer construction (as shown in FIG. 1(b)) is formed, solder is formed on the surface by passing the bumps having the bi-layer construction through a soldering reflow furnance. In addition to that, the solder surface layer 7c may be formed by printing the solder paste. The other aspects of the construction are same as that of FIG. 1(a), and therefore, explanation about these is omitted.

Figure 2:
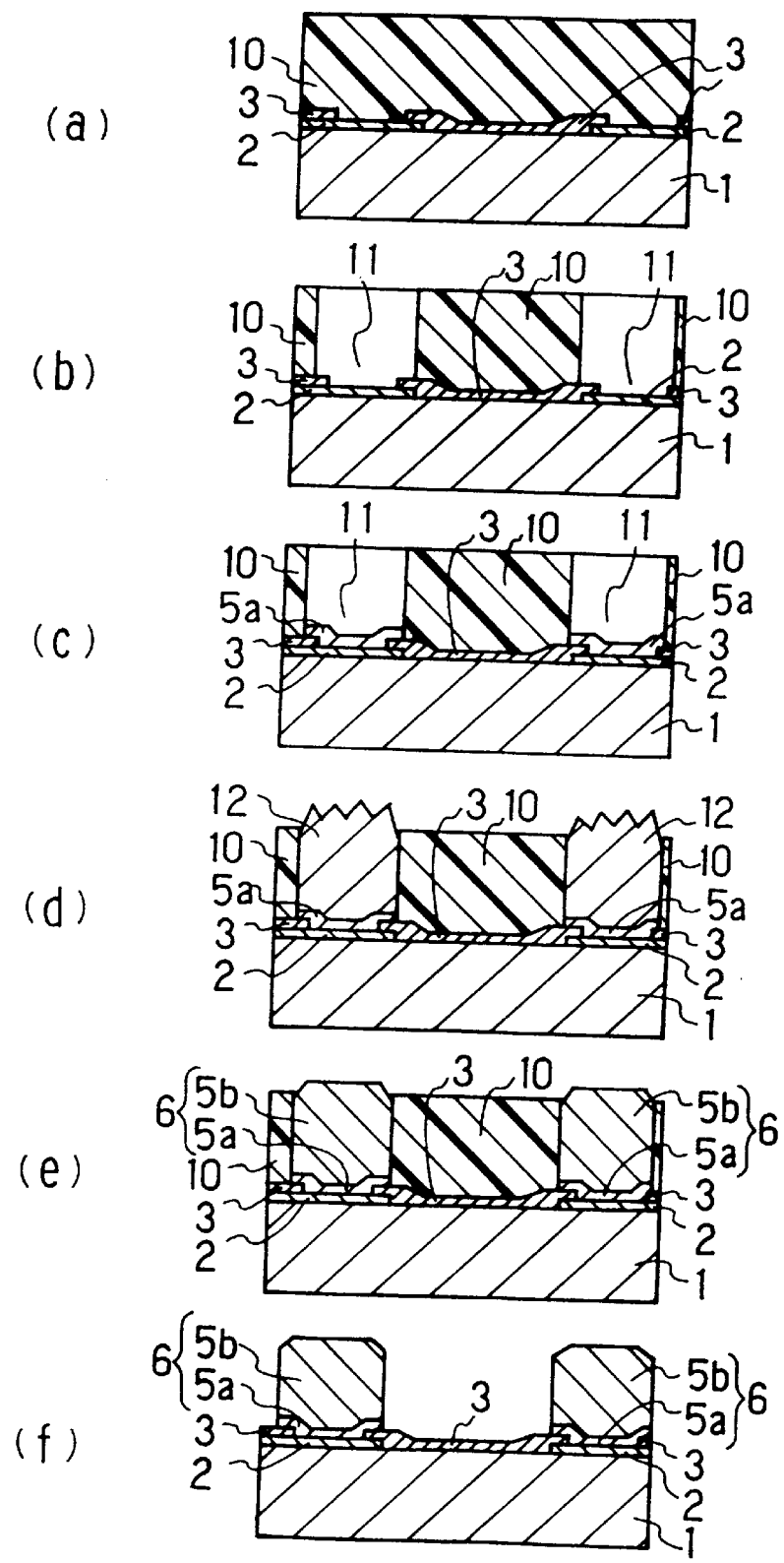
FIG. 2(a) is a cross sectional view showing a step of forming a substrate on which bumps are formed in the first embodiment of this invention.
FIG. 2(b) is a cross sectional view showing a step of forming a substrate on which bumps are formed in the first embodiment of this invention.
FIG. 2(c) is a cross sectional view showing a step of forming a substrate on which bumps are formed in the first embodiment of this invention.
FIG. 2(d) is a cross sectional view showing a step of forming a substrate on which bumps are formed in the first embodiment of this invention.
FIG. 2(e) is a cross sectional view showing a step of forming a substrate on which bumps are formed in the first embodiment of this invention.
FIG. 2(f) is a cross sectional view showing a step of forming a substrate on which bumps are formed in the first embodiment of this invention.

Next, a method of forming a bump having a bi-layer construction as shown in FIG. 1(b) will be explained referring to FIG. 2. As shown in FIG. 2(a), an aluminum thin film having a thickness of about 1 μm is formed on the periphery of the surface of the semiconductor chip 1 by electronic evaporation or sputtering method to form a pad electrode 2. Then, silicon nitride is deposited on the surface of the semiconductor chip 1 to cover the periphery of the pad electrode 2 by sputtering method and, to form a passivation film 3. Then, after the above-mentioned wafer process is completed, a dry film composed of photosensitive resist material is adhered to the whole surface of the semiconductor chip 1 to form a photosensitive resist film 10 having a thickness of about 50 μm.

Next, as shown in FIG. 2(b), exposing and developing treatment is applied to the photosensitive resist film 10 to expose the pad pattern portion, and an opening portion 11 having a diameter which is slightly larger than that of the pad size (i.e. size of the pad electrode 2 which is not covered with the passivation film 3, having a diameter of about 100 μm) is formed on the pad electrode 2.

Next, as shown in FIG. 2(c), a base layer 5a composed of sprayed alminum thick film having a thickness of about 20 μm is formed on the pad electrode 2 present in the opening portion 11 by spraying aluminum over the whole surface of the semiconductor chip 1 with a plasma spraying device. In general, according to the spraying method, a thick film having a comparatively high degree of purity can be formed at high speed for a large area. Therefore, the spraying method is excellent in forming a bump having a height of several 10 μm or higher with consideration of productivity. According to the spraying method, a film is not easily formed on the surface of plastic material having an elastic property, therefore, aluminum is deposited mainly on pad electrode 2 of opening portion 11.

Next, as shown in FIG. 2(d), the photosensitive resist film 10 formed on the chip 1 of the semiconductor chip 1 is left as it is, and a sprayed copper thick film 12 having a thickness of about 50 μm is formed on the base layer 5a present in the opening portion 11 by spraying copper over the whole surface of the semiconductor chip 1 with a plasma spraying device.

Next, as shown in FIG. 2(e), a surface layer 5b is formed by putting a flat plate (not shown in FIG.) on the semiconductor chip 1 and pressuring to flatten the top face of the sprayed copper thick film 12 (FIG. 2(d)). A bump 6 having bi-layer construction is formed comprising the base layer 5a and the surface layer 5b. Instead of pressing, the top face of the sprayed copper thick film may be flattened out by grinding or polishing.

Next, as shown in FIG. 2(f), the photosensitive resist film 10 is removed with a peeling liquid. According to the above-mentioned steps, a substrate on which bumps are formed as shown in FIG. 1(b) having a bi-layer construction is obtained.

In the embodiment of this invention, a photosensitive resist film 10 is formed by applying dry film made of photosensitive resist material to the whole surface of the semiconductor chip 1 after the wafer process is completed. However, it is not limited thereto. For example, photosensitive resist material may be coated on the whole surface of the semiconductor chip 1 in advance.

Second Embodiment

Figure 3:
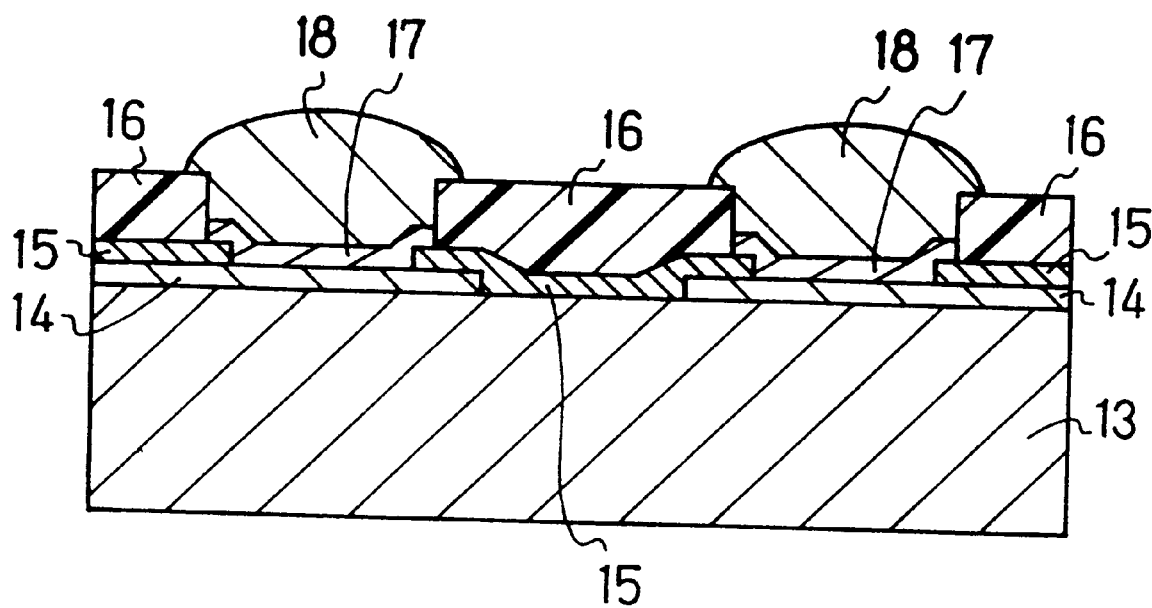
FIG. 3 is a cross sectional view showing a substrate on which bumps are formed in a second embodiment of this invention.

FIG. 3 is a cross sectional view showing a substrate on which bumps are formed. As shown in FIG. 3, on the surface of the semiconductor chip 13, a pad electrode 14 serving as a power source, ground, in-put and out-put terminal of signal is provided on the periphery of the chip. On the surface of the semiconductor chip 13, a passivation film 15 is formed to cover the periphery of the pad electrode 14. On the passivation film 15, except for the periphery, a resist film 16 is formed. In this case, a photosensitive polyimide film is used as the resist film 16 and the resist film 16 is not peeled or removed, therefore, the resist film 16 can be used semi-permanently. In this embodiment, the resist film 16 is used to prevent damage in a following step where a semiconductor chip 13 is connected with a substrate, and is also used as protective film. Therefore, any resin based material having moisture resistance or heat resistance other than polyimide, for example, PTFE, PE or polypyromellitic imide may be used. On the pad electrode 14, a base layer 17 composed of sprayed aluminum thick film having a thickness of about 20 μm is formed to cover the periphery of the passivation film 15. On the base layer 17, a bump 18 composed of sprayed copper thick film having a thickness of about 30 μm is formed. In this case, the bump 18 has to be formed protruding from the surface of the resist film 16. According to the above-mentioned explanation, it is difficult for a film to be deposited on the surface of the elastic material by the spraying method, therefore, the copper spraying thick film is mainly deposited on the base layer 17. Consequently, according to the spraying method, the bump 18 can be formed protruding from the surface of the resist film 16.

Hereinafter, a method of forming bumps will be explained referring to FIG. 3. According to the method of forming bumps of this invention, in forming the connecting portion between the bumps and the electrode, at least one portion of the oxide layer at the surface of the electrode is removed or penetrated at the time the bumps are formed. Specifically, this invention has features such that the connecting layer between the metallic thick film and the pad electrode composed of the bump is formed by the spraying method. In this case, it is preferable that the bumps are formed by plasma spraying method. In addition to that, it is preferable that the spray particle is deposited in an inert atmosphere or in a reducing atmosphere.

Figure 4:
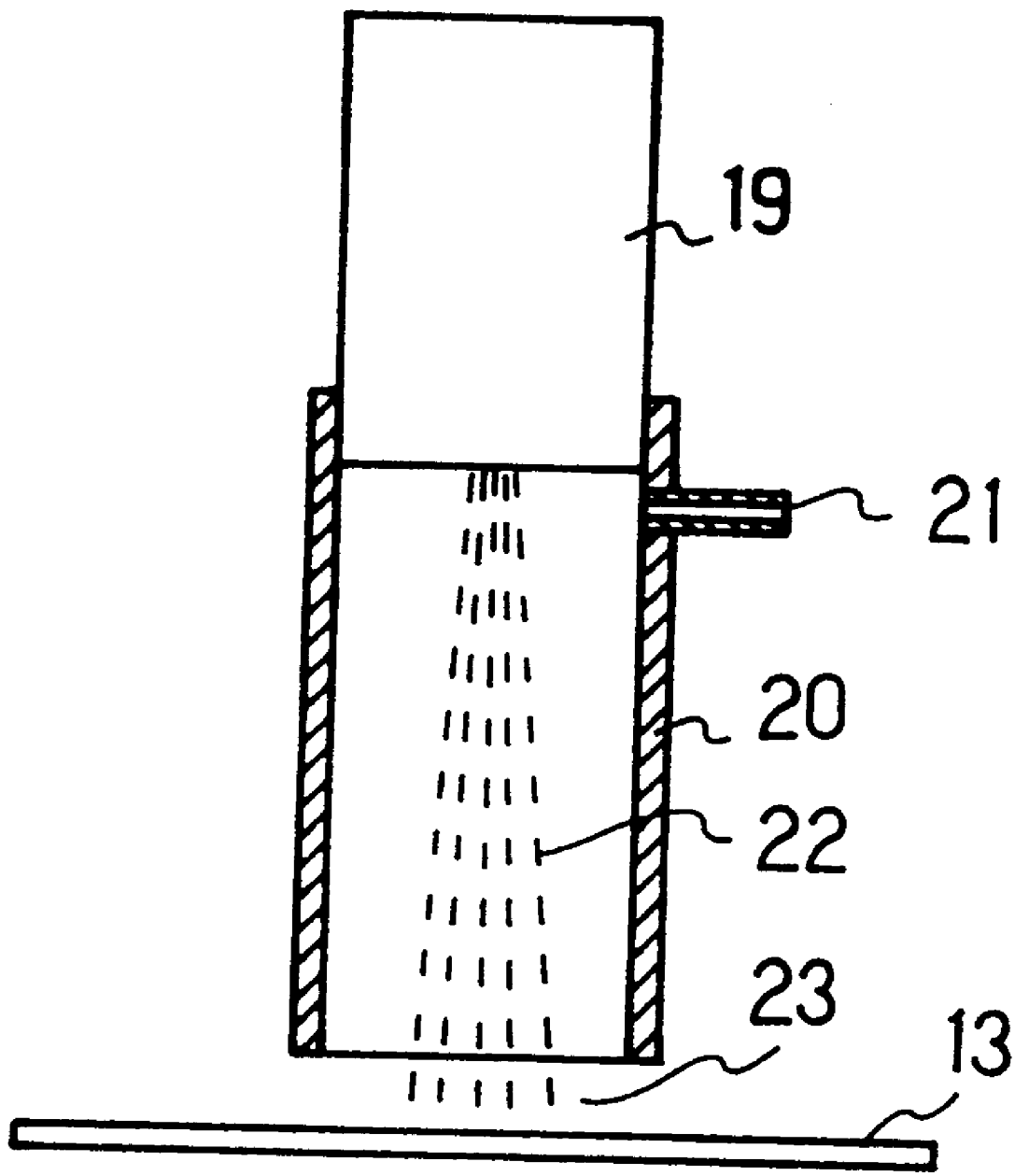
FIG. 4 is a schematic illustration showing a plasma spraying device used in the second embodiment of this invention.

FIG. 4 is a schematic illustration showing a plasma spraying device used in the method of forming bumps of this invention. In FIG. 4, 19 indicates a plasma spraying torch and on the end of the torch 19, a cylindrical shielding nozzle 20 is provided. The region 23 where the semiconductor chip 13 hits is prevented from having an oxidizing atmosphere by the plasma spray torch having a cylindrical shielding nozzle provided on the tip. As a result, preferable bumps having small electric resistance that are not oxidized can be formed. At the top of the side wall of the shielding nozzle, a gas port 21 is provided. In addition to that, the region 23 where a spray particle hits can be maintained in an inert atmosphere or a reducing atmosphere by supplying inert gas such as argon gas or reducing gas such as hydrogen from the gas port. Consequently, the bumps having more preferable electric properties can be obtained. In addition to that, in forming a sprayed thick film for the whole surface of the semiconductor chip 13, either the torch 19 or the semiconductor chip 13 has to be moved horizontally while spraying.

When a bump 18 as shown in FIG. 3 is formed by the spraying method, the spray particle 22 shown in FIG. 4 penetrates the surface oxide film of the base film 17 (sprayed aluminum thick film) formed on the pad electrode (aluminum thin film) of the semiconductor chip 13 to be deposit. As a result, the contact resistance between the pad electrode 14 and the bump 18 can be reduced as low as several milliohm, which is small enough for practical use. It is assumed that in the inert atmosphere or the reducing atmosphere, the spray particle having a diameter ranging from several μm to several tens μm hits the pad electrode 14 at a speed of several tens m/sec. or several hundreds m/sec. at a temperature close to the melting point of the material of the particle, about several 100° C. Therefore, a portion of the surface oxide layer of the base layer 17 is removed or penetrated to deposit a thick film on the pad electrode 14.

In addition to that, unlike the bumps formed by the printing method, the bumps formed by the spray method have a high purity without containing organic binder components. Therefore, the bumps have small electric resistance and gas is not released after mounting. Consequently, the bumps formed by the spraying method have a high reliability.

Further, this invention pays attentions to features such as the construction or shape of the sprayed film. Depending on the material of the film or the forming conditions, in general, a pore or a clearance presents inside the sprayed thick film.

The above-mentioned sprayed thick film absorbs stress easily in comparison with the bulk, and the stress applied to the bump caused by the difference of thermal expansion between the circuit board and the semiconductor chip on which bumps of the sprayed thick film are formed can be reduced. Therefore, the reliability of connecting the semiconductor chip and the circuit board can be increased.

Further, the sprayed thick film has a pore or a clearance inside. Therefore, connecting material such as solder or conductive paste soaks through the clearance and into the inside of the bump. As a result, the contact area between the bumps and connecting material increases, and, the contact resistance can be reduced.

Third Embodiment

Figure 5:
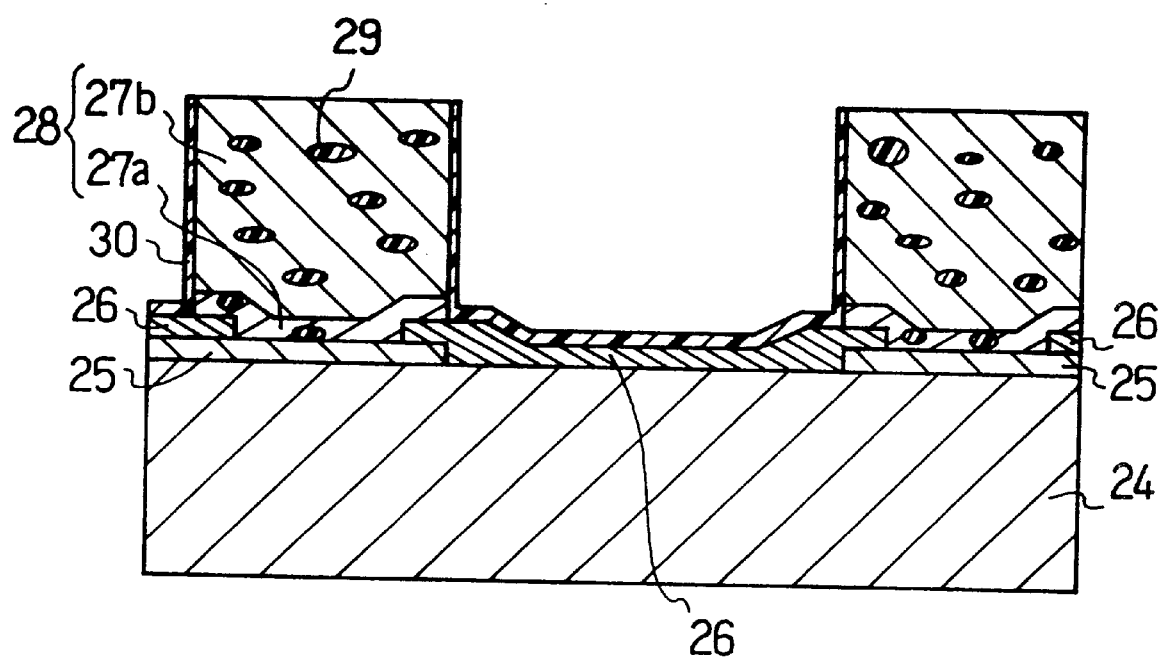
FIG. 5 is a cross sectional view showing a substrate on which bumps are formed in a third embodiment of this invention.
Figure 6A:
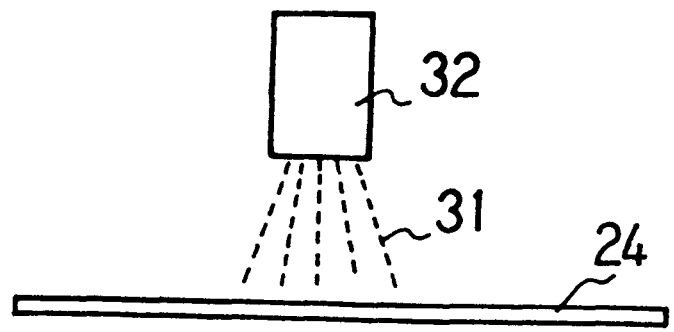
FIG. 6(a) is a cross sectional view showing a step of spray coating in the method of forming bumps in the third embodiment of this invention.
Figure 6B:
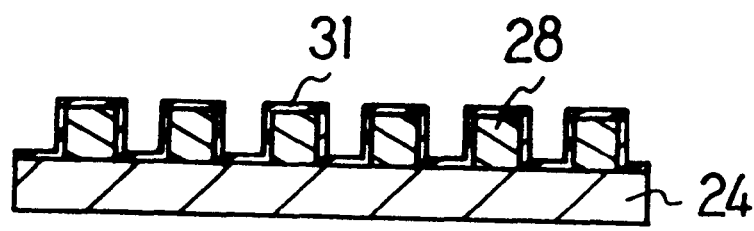
FIG. 6(b) is a cross sectional view showing a step of spray coating in the method of forming bumps in the third embodiment of this invention.

FIG. 5 is a cross sectional view showing a substrate on which bumps are formed of a third embodiment of this invention. As shown in FIG. 5, on the surface of the semiconductor chip 24, a pad electrode 25 serving as a power source, ground, in-put and out-put terminal of signal is provided on the periphery of the chip. On the surface of the semiconductor chip 24, a passivation film 26 is formed to cover the periphery of the pad electrode 25. On each pad electrode 25, a base layer 27a composed of plasma sprayed aluminum film having a thickness of about 20 μm is formed to cover the periphery of the passivation film 26. On the base layer 27a, a surface layer 27b composed of plasma sprayed copper film having a thickness of about 30 μm is formed. A bump having a bi-layer construction is composed of the base layer 27a and the surface layer 27b. As mentioned in the second embodiment of this invention, a sprayed film has more pores and clearances, depending on the material and forming condition of the film, in comparison with films formed by other methods. In the bump 28 of this embodiment, the pore or the clearance presents inside the plasma sprayed aluminum film (base layer 27a) and plasma sprayed copper film (surface layer 27b) are impregnated with epoxy based resin. In addition to that, a coating layer 30 composed of epoxy based resin is formed on the side surface of the bump 28. The base layer 27a composed of plasma sprayed aluminum film and the surface layer 27b composed of plasma sprayed copper film are formed by a method explained in the first embodiment of this invention. (FIG. 2) As shown in FIG. 6(a), after the base layer 27a composed of plasma sprayed aluminum film and the surface layer 27b composed of plasma sprayed copper film are formed, a pore or a clearance can be impregnated by spray coating easily. That is, on the semiconductor chip 24 where sprayed bumps are formed, epoxy based resin 31 having a comparatively low viscosity is sprayed from a spray nozzle 32. In this case, the semiconductor chip 24 is rotated in the horizontal condition or moved vertically and horizontally. As a result, epoxy based resin 31 is coated evenly on the surface of the semiconductor chip 24 including bumps 28, and the pore or the clearance present inside the spray bump 28 is impregnated with epoxy based resin 31. In addition to that, the pore or the clearance can be impregnated with epoxy based resin 31 by a spin coating method.

Figure 6C:
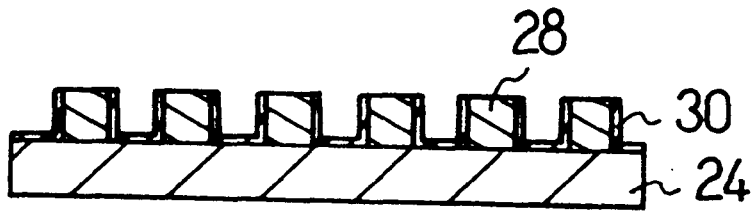
FIG. 6(c) is a cross sectional view showing a step of spray coating in the method of forming bumps in the third embodiment of this invention.

Next, the semiconductor chip 24 is heated to be 100° C., and the epoxy based resin 31 is dried and hardened. However, in this condition, the upper surface of the bump 28 is coated with epoxy based resin 31, and an electric connection between the circuit board and the semiconductor chip 24 can not be obtained. Therefore, as shown in FIG. 6(c), several μm of the top surface of the bump 28 is removed by polishing to expose the metallic surface of the bump 28. Further, height accuracy of each bump 28 also can be obtained by polishing.

Under high temperature and high moisture, metal is easily oxidized, and therefore, the electric resistance of bumps made of metallic materials may be increased after long periods. As above-mentioned, the sprayed thick film has pores or clearances inside. Therefore, oxidation can proceed gradually inside the bumps made of metallic sprayed thick film, and as a result, an electric resistance of the bumps may increase. According to this invention, an effect against the above-mentioned increase of electric resistance can be obtained. For example, the pore or the clearance present inside the plasma sprayed aluminum film (base layer 27a) and plasma sprayed copper film (surface layer 27b) composing the bump 28 are impregnated with epoxy based resin. Therefore, the inside of the bump 28 is prevented from being oxidized. In addition, a coating layer 30 composed of epoxy based resin is formed on the side surface of the bump 28, and therefore, the bump 28 is prevented from being oxidized and an increase of electric resistance is also prevented. As a result, even if the bump 28 is used for long periods under high temperature and high moisture, an electric resistance of the bump 28 is not increased. Therefore, the bump 28 having a stable electric property and high reliability can be realized.

In addition to that, resin is spread over the boundary between the bump 28 and pad electrode 25 by coating the resin on the semiconductor chip 24 including the bump 28. Therefore, adhesion between the bump 28 and the pad electrode 25 is reinforced. Consequently, handling of the bumps is improved and reliability of the bumps after being mounted on the substrate in actual use is improved. Further, the resin is elastic, so the effect of the sprayed thick film in reducing thermal stress between the bumps and the circuit board mentioned in the second embodiment is not prevented by coating the resin on the semiconductor chip 24 including the bump 28.

In the above-mentioned embodiments, epoxy based resin is coated with the semiconductor chip 24 including the bump 28. However, silica based resin, acrylic based resin or fluorine based resin that satisfies the conditions of moisture resistance and heat resistance properties may be used.

Fourth Embodiment

Figure 7:
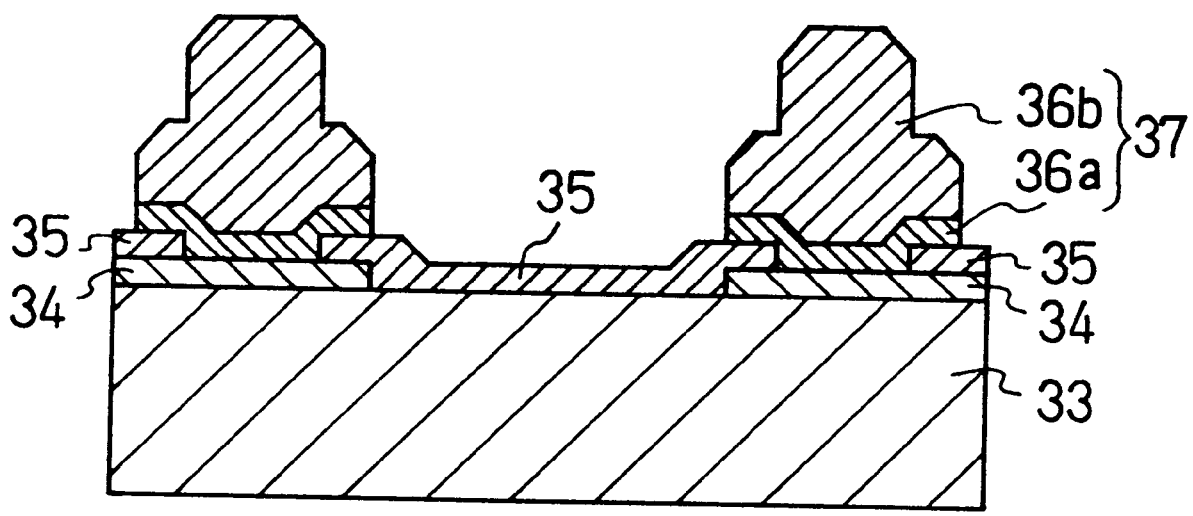
FIG. 7 is a cross sectional view showing a substrate on which bumps are formed in a fourth embodiment of this invention.

FIG. 7 is a cross sectional view showing a substrate on which bumps are formed in a fourth embodiment of this invention. As shown in FIG. 7, on the surface of the semiconductor chip 33, a pad electrode 34 serving as a power source, ground, in-put and out-put terminal of signal is provided at the periphery of the chip. On the surface of the semiconductor chip 33, a passivation film 35 is formed to cover the periphery of the pad electrode 34. On each pad electrode 34, a base layer 36a composed of plasma sprayed aluminum film having a thickness of about 20 μm is formed to cover the periphery of the passivation film 35. On the base layer 36a, a surface layer 36b composed of plasma sprayed superplastic metallic film having a thickness of about 30 μm is formed. A bump 37 having bi-layer construction is composed of the base layer 36a and the surface layer 36b. In this case, the surface layer 36b is formed have a two-step shape. When the bump 37 having a two-step shape is used, the protruding part of the first step serves as a reservoir for conductive resin or solder in connecting the semiconductor chip 33 and the circuit board by using conductive resin or solder. As a result, an excess of the conductive resin and solder is not spread over the surface. Therefore, bumps can be mounted on the substrate with more accuracy. In the embodiment, eutectoid alloy of zinc and aluminum containing 22 wt. % of aluminum is used, taking into consideration the magnitude and temperature of superplasticity. The temperature of superplasticity of eutectoid alloy of zinc and aluminum is about 250° C., which is preferable for shaping the surface layer 36 on the semiconductor chip 33.

Figure 8:
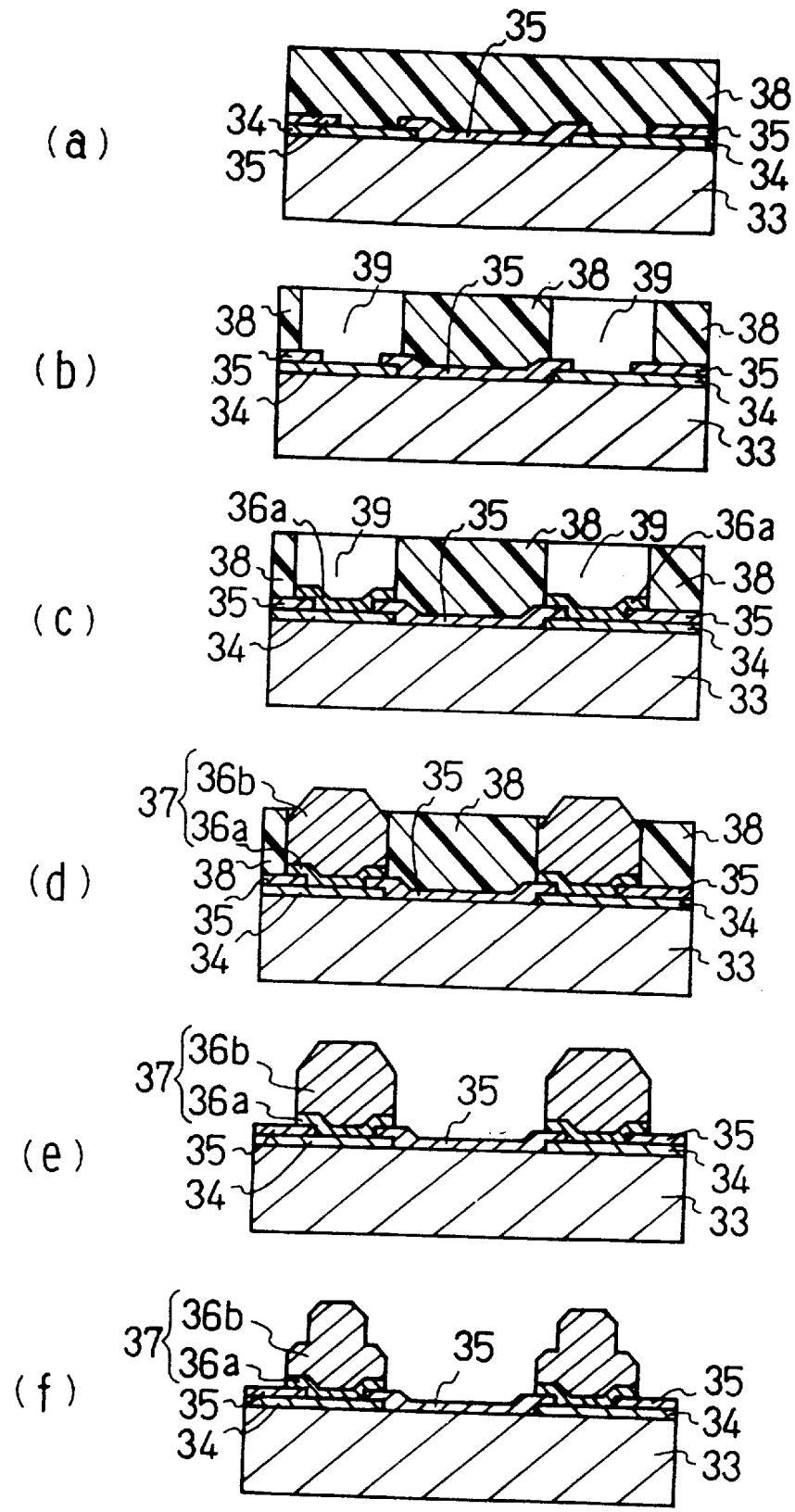
FIG. 8(a) is a cross sectional view showing a step of forming substrate on which bumps are formed in the fourth embodiment of this invention.
FIG. 8(b) is a cross sectional view showing a step of forming substrate on which bumps are formed in the fourth embodiment of this invention.
FIG. 8(c) is a cross sectional view showing a step of forming substrate on which bumps are formed in the fourth embodiment of this invention.
FIG. 8(d) is a cross sectional view showing a step of forming substrate on which bumps are formed in the fourth embodiment of this invention.
FIG. 8(e) is a cross sectional view showing a step of forming substrate on which bumps are formed in the fourth embodiment of this invention.
FIG. 8(f) is a cross sectional view showing a step of forming substrate on which bumps are formed in the fourth embodiment of this invention.

FIG. 8 shows a process for forming the bumps. As shown in FIG. 8 (*a*), an aluminum thin film having a thickness of about 1 μm is formed on the periphery of the surface of the semiconductor chip 33 by an electron beam vacuum deposition method or a sputtering method. Then, silicon nitride is deposited on the surface of the semiconductor chip 33 by a sputtering method to cover the periphery of the pad electrode 34 to form the passivation film 3. After the wafer process is completed, a photosensitive resist film 38 having a thickness of about 50 μm is formed by coating a dry film made of photosensitive resist material to the whole surface of the semiconductor chip 33.

Next, as shown in FIG. 8(*b*), exposing and developing treatment is applied to the photosensitive resist film 38 to expose the pad pattern portion, an opening portion 39 having a diameter which is slightly larger than the size of the pad, (the portion of pad electrode 34 which is not covered with the passivation film 35, diameter is about 100 μm) is formed on the pad electrode 34.

Next, as shown in FIG. 8(*c*), a base layer 36*a* composed of sprayed aluminum thick film having a thickness of about 20 μm is formed on the pad electrode 3 present in the opening portion 39 by spraying aluminum over the whole surface of the semiconductor chip 33 using the plasma spray device. When a film is formed by spraying method, it is not easy for a film to be formed on the surface of elastic plastic based material such as photosensitive resist film 38. Therefore, aluminum can be deposited mainly on the pad electrode 2 present inside of the opening portion 39.

Next, as shown in FIG. 8(*d*), a surface layer 36*b* composed of sprayed eutectoid alloy of zinc and aluminum thick film having a thickness of about 50 μm is formed on the base layer 36*a* in the opening portion 39 by spraying eutectoid alloy of zinc and aluminum over the whole surface of the semiconductor chip 33 using the plasma spraying device. In this case, as in the case shown in FIG. 8(*c*), eutectoid alloy of zinc and aluminum can be deposited mainly on the base layer 36*a* present inside of the opening portion 39. According to the above-mentioned process, the bump 37 having a bi-layer construction can be obtained.

Next, as shown in FIG. 8(*e*), the photosensitive resist film 38 is removed by using peeling liquid.

Next, as shown in FIG. 8(*f*), the temperature of the semiconductor chip 33 is maintained at 250° C., that is the superplasticity temperature of eutectoid alloy of zinc and aluminum, a concave die having a two-step shape (not shown) is put on the position of the pad and pushed over the surface layer 36*b* with predetermined pressure. The superplastic thick film (surface layer 36*b*) can be easily deformed by pressure with the concave die. Therefore, the surface layer 36*b* can be easily formed to have a two-step shape. According to the process, a substrate on which bumps 37 having the bi-layer construction as shown in FIG. 7 are formed is obtained.

In the embodiment of this invention, eutectoid alloy of zinc and aluminum is used, however, it is not limited thereto. For example, eutectoid alloy of bismuth and tin, eutectoid alloy of magnesium and aluminum or eutectoid alloy of lead and tin may be used.

In the embodiment of this invention, a surface layer 36*b* is formed by plasma spraying the superplastic metallic material, however, the method of forming the surface layer 36*b* is not limited thereto. For example, the surface layer 36*b* is formed as follows. First, the powder of superplastic metallic material is mixed together with binder to form a paste for printing. Then, the paste is printed on the surface of the base layer 36*a* and burned.

In the first, second, third and fourth embodiments of this invention, examples in which bumps are formed on the pad electrode of the semiconductor chip were explained. However, it is not limited thereto. This invention also applies to bumps formed on the electrode of a semiconductor wafer, circuit board or carrier substrate for CSP, or bumps formed on an electrode of various electronic parts such as sensor, resistance, capacitor, or inductance.

This invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, an all change which come within the meaning and range of equivalency of the claims are intended to be embraced therein.

What is claimed is:

1. A method of forming bumps by depositing particle of conductive material on an electrode formed on a substrate, wherein the particle of said conductive material is deposited on said electrode by removing at least a portion of a surface oxide layer of said electrode or by said particle of said conductive material penetrating a surface oxide layer.

2. The method of forming bumps according to claim 1, wherein the particle of the conductive material is deposited on the electrode by a spraying method.

3. The method of forming bumps according to claim 2, wherein said spraying method is a plasma spraying method.

4. The method of forming bumps according to claim 3, wherein a region where said particle of said conductive material hits has an inert atmosphere or a reducing atmosphere.

5. The method of forming bumps according to claim 1, wherein said bumps are formed to have a desirable shape comprising the steps of:

(a) depositing superplastic metallic material to be used as at least an upper layer of conductive material;

(b) heating the substrate to at least the superplasticity temperature of said superplastic metallic material; and (c) pressing said bump with a concave die having a desirable shape.

6. The method of forming bumps according to claim 5, wherein the material of said superplastic metallic material is one selected from a group consisting of eutectoid alloy containing zinc and aluminum, eutectoid alloy containing bismuth and tin, eutectoid alloy containing of magnesium and aluminum and eutectoid alloy containing of lead and tin.

* * * * *